(12) United States Patent
Wolfson et al.

(10) Patent No.: US 6,686,875 B1
(45) Date of Patent: Feb. 3, 2004

(54) BI-DIRECTIONAL AMPLIFIER MODULE FOR INSERTION BETWEEN MICROWAVE TRANSMISSION CHANNELS

(75) Inventors: Brandon J. Wolfson, Huntsville, AL (US); Larry T. Lowe, Huntsville, AL (US)

(73) Assignee: Phase IV Systems, Inc., Huntsville, AL (US)

( * ) Notice: Subject to any disclaimer, the term of this patent is extended or adjusted under 35 U.S.C. 154(b) by 0 days.

(21) Appl. No.: 10/264,371

(22) Filed: Oct. 4, 2002

(51) Int. Cl.[7] .................................................. G01S 7/28
(52) U.S. Cl. ..................... 342/175; 330/124 R; 333/248
(58) Field of Search ................................. 342/175, 373; 43/700 MS, 701, 778, 786; 330/53, 124 R, 137, 286, 295; 331/57; 333/21 A, 248; 370/498

(56) References Cited

U.S. PATENT DOCUMENTS

| | | | |
|---|---|---|---|
| 4,291,278 A | 9/1981 | Quine | 330/286 |
| 4,588,962 A | 5/1986 | Saito et al. | 330/286 |
| 4,825,172 A * | 4/1989 | Thompson | 330/124 R |
| 5,105,166 A | 4/1992 | Tsukii et al. | 330/277 |
| 5,124,980 A * | 6/1992 | Maki | 370/498 |
| 5,214,394 A * | 5/1993 | Wong | 330/286 |
| 5,365,368 A | 11/1994 | Hsu et al. | 359/341 |
| 5,481,223 A | 1/1996 | Wong | 330/124 R |
| 5,546,083 A * | 8/1996 | Elam | 342/175 |
| 5,600,286 A | 2/1997 | Livingston et al. | 333/26 |
| 5,736,908 A | 4/1998 | Alexanian et al. | 333/125 |
| 5,994,984 A * | 11/1999 | Stancil et al. | 333/248 |
| 6,329,949 B1 | 12/2001 | Barnett et al. | 343/700 |
| 2002/0032004 A1 * | 3/2002 | Widrow | 455/22 |
| 2003/0096575 A1 * | 5/2003 | Tuttlebee | 455/15 |
| 2003/0128075 A1 * | 7/2003 | Wood | 331/57 |

OTHER PUBLICATIONS

"Distributed amplifiers as duplexer/circulator components at S–band", Leisten, O.P.; Collier, R.J.; Bates, R.N.; Solid State Components for Radar, IEE Colloquium on, Feb. 12, 1988, pp.: 5/1–5/4.*

"A 94 GHz single–chip FMCW radar module for commercial sensor applications", Tessmann, A.; Kudszus, S. et al; Microwave Symposium Digest, 2002 IEEE MTT–S Int'l, vol.: 3, Jun. 2–7, 2002 p: 1851–1854.*

"High performance voltage controlled bi–directional amplifiers in support of component reuse for large aperture phase array", Yang, J.M. et al; Microwave Symposium Digest, 2002 IEEE MTT–S Int'l, vol.: 1, Jun. 2–7, 2002 p: 65–68.*

"Wideband bidirectional MMIC amplifiers for new generation T/R module", Tsukii, T.; Houng, S.G.; Schindler, M.J.; Microwave Symposium Digest, 1990., IEEE MTT–S International, May 8–10, 1990 pp.: 907–910 vol. 2.*

Cheng, Nai–Shuo, et al., 40–W CW Broad–Band Spatial Power Combiner Using Dense Finline Arrays; IEEE Transactions on Microwave Theory and Techniques, vol. 47, No. 7, 1070–1076, Jul. 1999.

(List continued on next page.)

Primary Examiner—John B. Sotomayor
(74) Attorney, Agent, or Firm—Thomas Kayden Horstemeyer & Risley, L.L.P.

(57) ABSTRACT

A waveguide bi-directional amplifier module is illuminated by a downstream illumination source and an upstream illumination source. The illumination sources are coupled to an array having waveguide to microstrip converters that provide for upstream and downstream electrical signals. Switchable amplifiers provide for amplification in both directions for the electrical signals and the converters coherently combine the output of the amplifiers to provide increased power to the electromagnetic wave entering the waveguide.

32 Claims, 11 Drawing Sheets

OTHER PUBLICATIONS

Cheng, Nai–Shuo, et al., A 120–W X–Band Spatially Combined Solid–State Amplifier; IEEE Transactions on Microwave Theory and Techniques, vol. 47, No. 12, 2557–2561, Dec. 1999.

Jeong, Jinho, et al., 1.6– and 3.3–W Power–Amplifier Modules at 24 GHz Using Waveguide–Based Power–Combining Structures, IEEE Transactions on Microwave Theory and Techniques, vol. 48, No. 12, 2700–2708, Dec. 2000.

Robert A. York, Some Consideratiosn for Optimal Efficiency and Low Noise in Large Power Combiners, Submitted to IEEE Transactions on Microwave Theory and Techniques, 2002.

Jia, Pengcheng, et al., Design of Waveguide Finline Arrays for Spatial Power Combining, IEEE Transactions on Microwave Theory and Techniques, vol. 49, No. 4, 609–614, Apr. 2001.

Robert A. York, Broadband Microwave Power Combiners Using Active Arrays in an Oversized Coaxial Waveguide, ECE Department University of California Santa Barbara, CA., Final Report 1997–98 for Micro project 97–217.

Cheng, Nai–Shuo, et al., Waveguide–based Spatial Power Combiners, University of California, Santa Barbara, CA. Dissertation, Academic—UCSB—Electrical and Computer Engineering, Pub. 1999, NOTIS No. ALH8997 MA.

* cited by examiner (Top View)

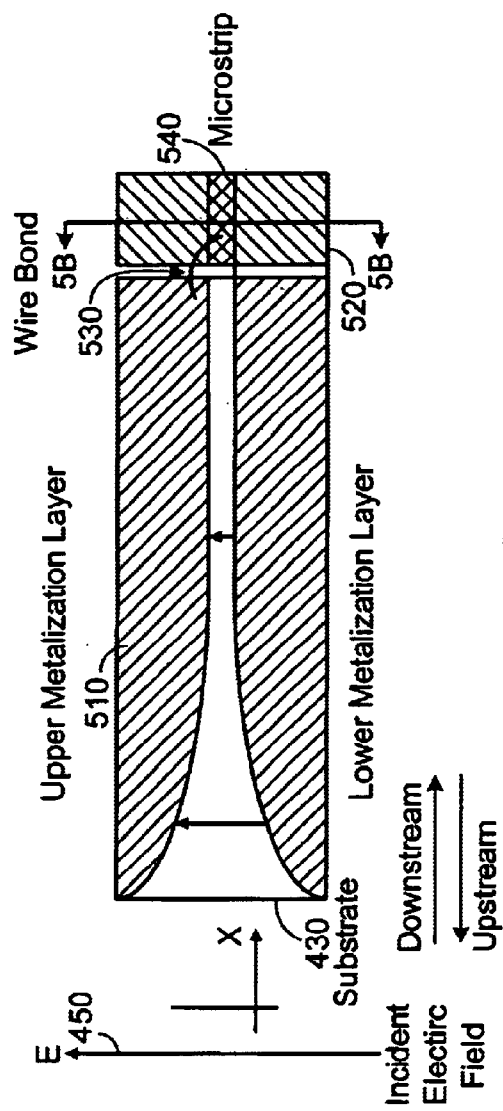
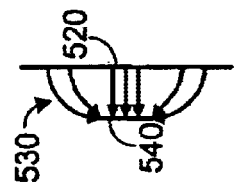
FIG. 5A
FIG. 5B

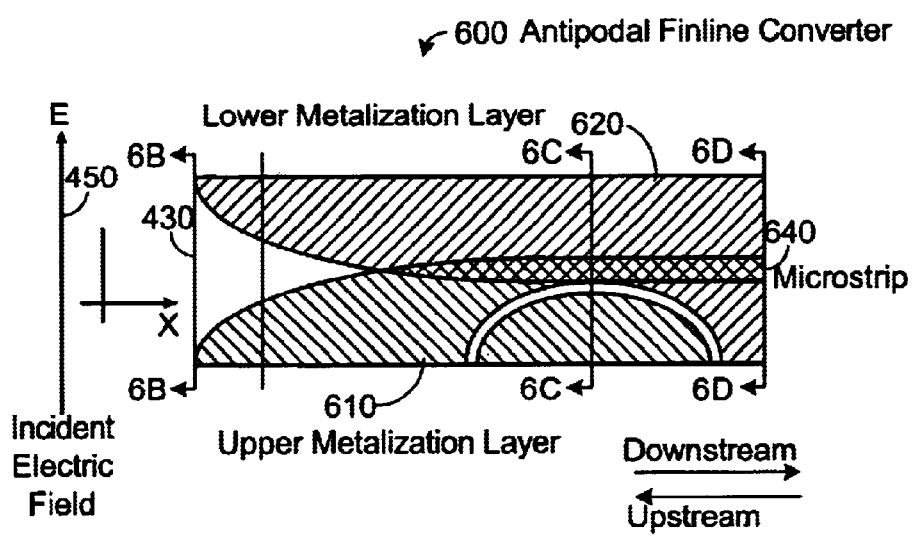
FIG. 6A
  
FIG. 6B  FIG. 6C  FIG. 6D

BI-DIRECTIONAL AMPLIFIER MODULE FOR INSERTION BETWEEN MICROWAVE TRANSMISSION CHANNELS

BACKGROUND OF THE INVENTION

1. Field of the Invention

The present invention relates to solid state microwave amplifiers and, in particular, to a bi-directional amplifier module that incorporates spatial combiners and solid state amplifiers.

2. Related Art

High-power amplifiers are a necessary component of most RF transmission systems at microwave and millimeter wave frequencies. Currently, most systems that require high power (greater than approximately 50 Watts) use traveling wave tube (TWT) amplifiers. TWT amplifiers may have output power in the kilowatt range, but such amplifiers also have large noise figures and require high-voltage power supplies. In addition, TWTs are typically very large, expensive and unreliable. Solid state amplifiers, on the other hand, have a lower noise figure and use a low-voltage power supply. As compared to TWT amplifiers, solid state amplifiers are smaller, lighter, more reliable, easier to manufacture and less expensive. For the foregoing reasons, solid state amplifiers are generally more desirable than TWT amplifiers. However solid state amplifiers have a limited output power (less than approximately 10 Watts) making them unsuitable for some microwave applications.

The power from many individual solid state amplifiers or microwave integrated circuits (MICs) can be coherently added or combined to increase the overall output power. A conventional power combining circuit for increasing overall output power is a corporate combiner. In a corporate combiner, an input signal is split into N stages to form $2^N$ separate microstrip lines. Unfortunately, a corporate combiner generally has insertion losses and resistive losses along with phase coherency problems in the $2^N$ channels that significantly impact corporate combiner efficiency, particularly when it has a large number of stages. Indeed, the efficiency for a large number of stages is low. However, corporate converters are useful in many applications and will continue to be utilized for supporting specific microwave systems.

Other types of MIC combiners utilize spatial arrangement techniques, such as spatial power splitting and combining. The term spatial power splitting and combining generally refers to the placement of multiple microstrip transitions within a waveguide, coaxial cable or other microwave channel in order to capture and split propagating electromagnetic energy and transfer such energy onto multiple microstrip transmission lines as electrical signals. The electrical signals on the microstrip transmission lines are amplified by solid state amplifiers, and the outputs of these amplifiers are coherently combined via microstrip-to-waveguide converters and inserted or re-launched as amplified electromagnetic energy into a waveguide. The resulting amplified microwave signal may then be coupled, via the waveguide, to a radar antenna, a communications antenna, a transceiver, or other device. The design trade-offs between a spatial combiner and a corporate combiner are discussed at length in current literature and are generally well-known by those skilled in the art.

Currently, when a bi-directional exchange of microwave signals is desired, a two-way link is constructed using two separate modules and microwave channels. A first transmitter and receiver pair use a first channel, such as a waveguide, for sending microwave signals in one direction, and a second transmitter and receiver pair use a second channel for transmission in the other direction. Amplification is provided using conventional amplifiers, such as TWTs, corporate converters with MICs, or spatial converters with MICs.

SUMMARY OF THE INVENTION

In general the present invention pertains to a system and method for providing bi-directional amplification of microwave signals via a bi-directional amplifier module that can be coupled to a microwave channel, such as a waveguide or coaxial cable. Utilization of such a bi-directional amplifier module helps to reduce space requirements and cost for various applications, such as microwave communications and radar, for example.

A bi-directional amplifier module in accordance with an exemplary embodiment of the present invention is illuminated by a downstream illumination source and an upstream illumination source. The illumination sources are coupled to separate ends of an array amplifier modules having waveguide to microstrip converters that provide for upstream and downstream energy flow. Switchable amplifiers provide for amplification in both directions, and the converters coherently combine the output of the amplifiers to provide increased power to the electromagnetic signal entering the waveguide.

The present invention may also be viewed as a bi-directional amplification method. A method in accordance with an exemplary embodiment of the present invention can be broadly conceptualized by the following steps: illuminating an array of upstream converters and downstream converters; converting the illuminations to downstream electrical signals and upstream electrical signals for transmission on microstrip transmission lines; receiving the downstream electrical signals at downstream amplifiers; combining downstream amplified signals at the upstream converter for downstream illumination; receiving the upstream electrical signals at upstream amplifiers; and combining upstream amplified signals at the downstream converter for upstream illumination.

BRIEF DESCRIPTION OF THE DRAWINGS

The invention can be better understood with reference to the following drawings. The elements of the drawings are not necessarily to scale relative to each other, emphasis instead being placed upon clearly illustrating the principles of the invention. Furthermore, like reference numerals designate corresponding parts throughout the several views.

FIGS. 5A and 5B are diagrams illustrating an exemplary arrangement of metallic layers for a slotline converter that converts electromagnetic waves to/from electrical signals that go to or from the amplifiers of FIG. 4.

FIGS. 6A, 6B, 6C, and 6D are diagrams illustrating an exemplary arrangement of metallic layers for an antipodal finline converter that converts electromagnetic waves to/from electrical signals that go to or from the amplifiers of FIG. 4.

DETAILED DESCRIPTION

In general, the present invention provides a bi-directional amplifier module and method for amplifying downstream and upstream microwave signals transmitted in waveguides. More specifically, a bi-directional amplifier module, preferably having at least two ports, is provided that has one or more trays of bi-directional amplifiers and converters. The bi-directional amplifier module may be inserted inline and between two waveguides or other types of microwave transmission channels. The cross section of the module cavity of the bi-directional amplifier module preferably is shaped similar to the cross section of the connecting waveguides. When a first electromagnetic signal within a first waveguide of the waveguides travels in a first direction into the bi-directional amplifier module, the bi-directional amplifier module converts the electromagnetic signal into an electrical signal (having electromagnetic characteristics) that is amplified by a first amplifier which is preferably a microwave integrated circuit ("MIC") having one or more solid state amplifiers. The amplified signal is then coherently converted back to an electromagnetic wave that illuminates, i.e., is re-launched, into a second waveguide.

When a second electromagnetic signal enters (the signal may be an echo or a signal from a second transmitter) the second waveguide going in the opposite direction of the first electromagnetic signal, the bi-directional amplifier module performs the above described process in reverse such that the second electromagnetic signal is amplified and re-launched into the first waveguide. Thus, the first and second electromagnetic signals, which preferably travel in opposite directions and in mutually exclusive time bands, are both amplified by the bi-directional amplifier module 140.

Figure 1:
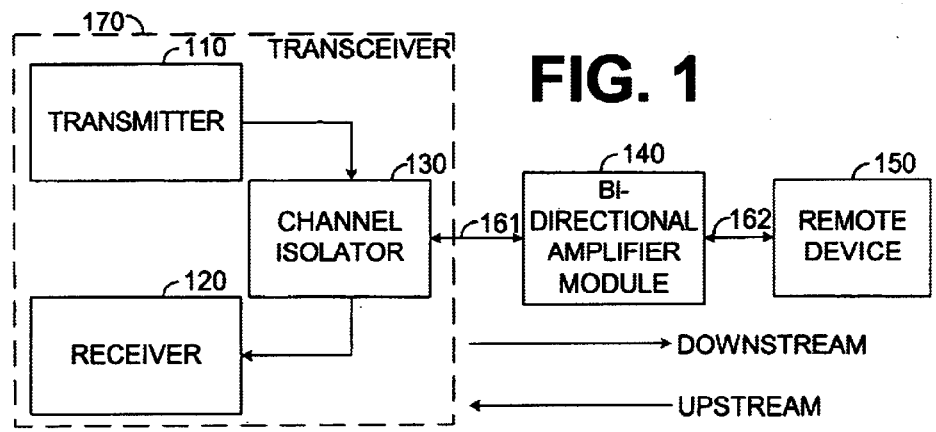
FIG. 1 illustrates a microwave communication system with upstream and downstream signals coupled to a bi-directional amplifier module.

FIG. 1 depicts a microwave communication system that employs a bi-directional amplifier module 140 in accordance with an exemplary embodiment of the present invention. Referring to FIG. 1, a transmitter 110 of transceiver 170 provides a first electromagnetic signal for downstream transmission, and a receiver 120 receives a second electromagnetic signal that has been transmitted in the upstream direction and that has been amplified by the bi-directional amplifier module 140. The receiver 120 and transmitter 140 may be coupled via a channel isolator 130, such as a circulator, to a bi-directional amplifier 140 that directs the first electromagnetic signal from the transmitters 110 towards, in a downstream direction, the bi-directional amplifier module 140 and a remote device 150 over a first waveguide 161. The bi-directional amplifier 140 further directs a second electromagnetic signal over a second waveguide 162 from the remote device 150 towards, in an upstream direction, the bi-directional amplifier 140 and receiver 120.

Preferably, the waveguides 161, 162 coupled to the bi-directional amplifier module 140 are rectangular and have the same or similar size and shape. The bi-directional amplifier module 140 may provide approximately the same gain and/or power output in both directions, but may also provide different upstream and downstream gains or power outputs, if desired. For example, for a radar system, more power output is typically desired for the downstream signal than for the upstream signal. Hence, for radar systems, the bi-directional amplifier module downstream amplifier power output is significantly greater than upstream amplifier power output. Further, for a radar system, the remote device 150 may comprise a radar antenna, and the upstream signal may be an echo from a target detected by the radar system.

The bi-directional amplifier module 140 of FIG. 1 has two ports wherein port one 164 (FIG. 2) is coupled to the first waveguide 161 and the port two 165 is coupled to the second waveguide 162. Port one 164 preferably receives the downstream electromagnetic signal, transmitted by the transmitter 110, exiting the right side of the channel isolator 130. Port one 164 of the bi-directional amplifier module 140 may also be the exit port for an amplified upstream electromagnetic signal that is transmitted (or echoed) from the remote device 150 and is received by the receiver 120. Port two 165 of the bi-directional amplifier module is the port coupled to the remote device 150 over the second waveguide 162. To assist with understanding signal flow in the various figures, the term "downstream" shall refer to the direction going from transmitter 110 to the remote device 150, and the term "upstream" shall refer to the direction going from the remote device 150 to the receiver 120.

Figure 2:
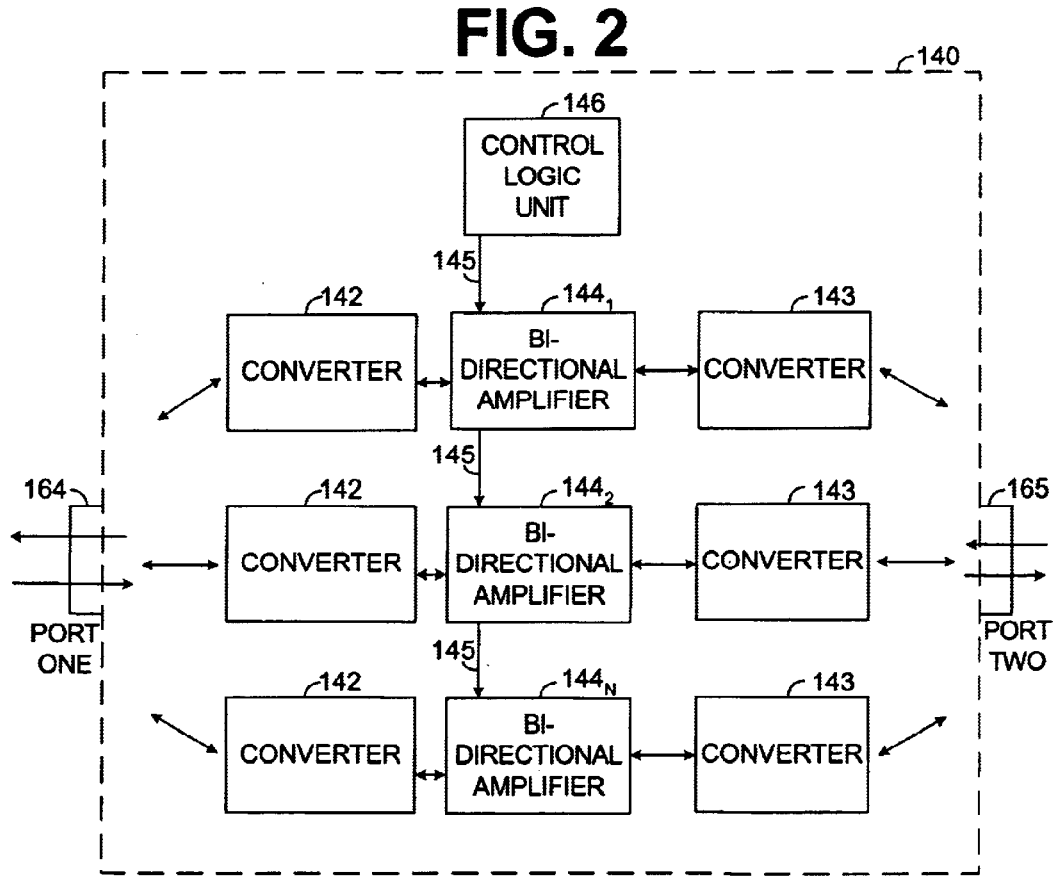
FIG. 2 is a block diagram illustrating an exemplary embodiment of the bi-directional amplifier module shown in FIG. 1.

As will be described in more detail herein, both upstream and downstream electromagnetic signals may travel in waveguides 161, 162. When a downstream electromagnetic signal reaches the bi-directional amplifier module 140, as shown in FIG. 2, the electromagnetic signal preferably illuminates one or more converters 142 with approximately equal amounts of electromagnetic energy. The converters 142, which act as small two-directional antennas, then convert the received electromagnetic energy into electrical signals, having electromagnetic characteristics, that are each amplified by one or more downstream amplifiers 330 (FIG. 3) of the bi-directional amplifiers 144. The converters 142 are preferably antipodal finline to microstrip converters as illustrated in FIG. 6. However, other types of converters, such as slotline converters (FIG. 5), may provide the electromagnetic signal to electrical signal conversion.

The electrical signals from each converter 142 are preferably coupled to the bi-directional amplifiers 144. The configuration and operation of the bi-directional amplifiers 144 is preferably controlled by control logic unit 146 to provide amplification of the downstream electrical signals in accordance with a timing scheme. Note that the bi-directional amplifiers 144 preferably are prohibited from simultaneously amplifying and/or communicating downstream and upstream signals. Furthermore, when "N" bi-directional amplifiers of equal gain and output power are operating in the bi-directional amplifier module 140, then the output power of the bi-directional amplifier module 140 is essentially N times the power output of each amplifier 144.

After amplification by the bi-directional amplifiers 144, each downstream electrical signal, may be coupled to a second set of converters. Each of the second set of the converters 143 preferably converts its respective amplified downstream electrical signal into an amplified downstream electromagnetic signal. The downstream electrical signals output by the converter 143 coherently illuminate the second waveguide 162 connected to port two 165 of the bi-directional amplifier module 140. The phase difference of the converter outputs is preferably small enough such that the amplified electromagnetic signals coherently combine to provide a single amplified electromagnetic signal directed downstream toward the remote device 150.

After the transmitter 110 has completed transmission of the downstream electromagnetic signal, control logic unit 146 preferably causes the bi-directional amplifiers 144 to change from a downstream amplification state to an upstream amplification state. When in the downstream amplification state, the bi-directional amplifiers 144 amplify and output to the converters 143. When in the upstream amplification state, the bi-directional amplifiers 144 amplify and output to the converters 142.

Once the amplifiers 144 transition to the upstream amplification state, an upstream electromagnetic signal, such as for example a radar echo signal, may arrive at port two 165 of the bi-directional amplifier module 140. The upstream electromagnetic signal is preferably split in approximately equal amounts of electromagnetic energy that is received by each of the converters 143. Because the control logic 146 has configured each of the bi-directional amplifiers 144 for upstream amplification, upstream electrical signals are amplified by the amplifiers 144 and converted to upstream amplified electromagnetic signals by the converter 142 in essentially the same way described above that the downstream electromagnetic signals are amplified by the amplifiers 144 and are converted to downstream electrical signals by the converters 142. A single amplified coherent upstream electromagnetic signal then travels from the bi-directional amplifier module 140 to the receiver 120 via the channel isolator 130.

Figure 3:
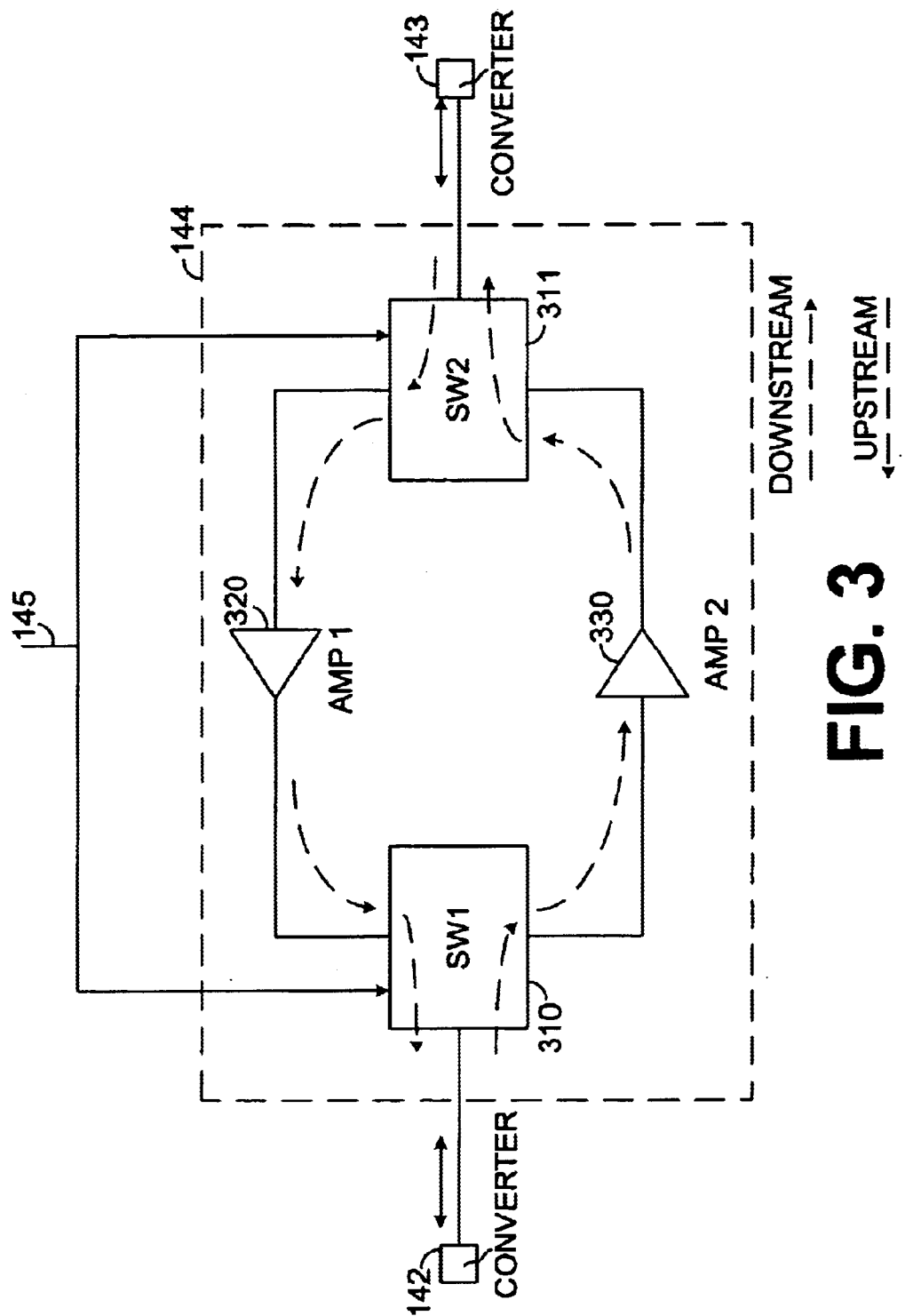
FIG. 3 is a diagram illustrating an exemplary embodiment of bi-directional amplifiers shown in FIG. 2.

Note that there are various configurations of the bi-directional amplifiers 144 that may be employed in order to achieve the functionality described above. FIG. 3 depicts an exemplary configuration that helps to reduce undesirable interference and feedback within the bi-directional amplifiers 144. Two switches 310 and 311 are coupled to and controlled by a control signal 145 transmitted by the control logic unit 146. The switches 310 and 311, which may each comprise a network of switches and other components, are designed to couple signals and to obtain a desired or specified level of isolation and impedance termination. When the signal 145 indicates that the amplifier of FIG. 3 is to be in a downstream amplification state, a first switch 310, SW1, electrically couples the converter 142 to the input of amplifier 330 and electrically isolates converter 142 from the output of amplifier 320. Further, the second switch 311, SW2, electrically couples the output of amplifier 330 to the converter 143, and electrically isolates the input of amplifier 320 from the converter 143. When the signal 145 indicates that the amplifier 144 of FIG. 3 is to be in an upstream amplification state, the first switch 310, SW1, electrically couples the converter 142 to the output of amplifier 320 and electrically isolates converter 142 from the input of amplifier 330. Further, the switch 311 electrically couples the converter 143 to the input of amplifier 320 and electrically isolates converter 143 from the output of amplifier 330.

Moreover, when the amplifier 144 is in the downstream amplification state, the switch 311 preferably prevents electrical energy from passing to the amplifier 320. However, some energy output by the amplifier 330 may bleed through the switch 311 to the input of amplifier 320, and any energy received by the input of amplifier 320 is amplified. The switch 310, which preferably appears as a matched load to the output of the amplifier 320 when in the downstream amplification state, limits or restricts energy amplified by the amplifier 320 from interfering with the downstream signal.

Moreover, when the amplifier 144 is in the upstream amplification state, the switch 310 preferably prevents electrical energy from passing to the amplifier 330. However, some energy output by the amplifier 330 may bleed through the switch 310 to the input of amplifier 330, and any energy received by the input of amplifier 330 is amplified. The switch 311, which preferably appears as a matched load to the output of the amplifier 330 when in the upstream amplification state, limits or restricts energy amplified by the amplifier 330 from interfering with the upstream signal.

In the preferred embodiment of the present invention, as illustrated in FIGS. 2 and 3, it is not necessary for amplification to be the same in both directions. For example when the bi-directional amplifier module 140 is used within a radar system, it is typically desirable to have the downstream power greater than that of the upstream power. To provide for more downstream power, each downstream amplifier 320 may have a greater power output than each upstream amplifier 330. In another embodiment, for a radar system, each downstream amplifier 320 may have power gain, and some of the upstream amplifiers 330 may be replaced by a pass through (a direct connection between the converters) such that signals travelling in the upstream direction are not amplified. Variations in upstream and downstream amplifier gains that are adapted for other applications are possible. Isolating other electrical components such as active filters, passive filters, sensors, signal conditioners, voltage dividers, power detectors, electric field detectors or other elements in place of or in addition to bi-directional amplifiers 144 may provide for a variety of applications. The structure of the present invention provides for processing downstream and upstream signals using a variety of components, thereby providing for different processing of downstream and upstream signals. Further, for applications where timing is not critical, the switches 310 and control logic unit 146 may be replaced by diplexers or other directional couplers.

Figure 4:
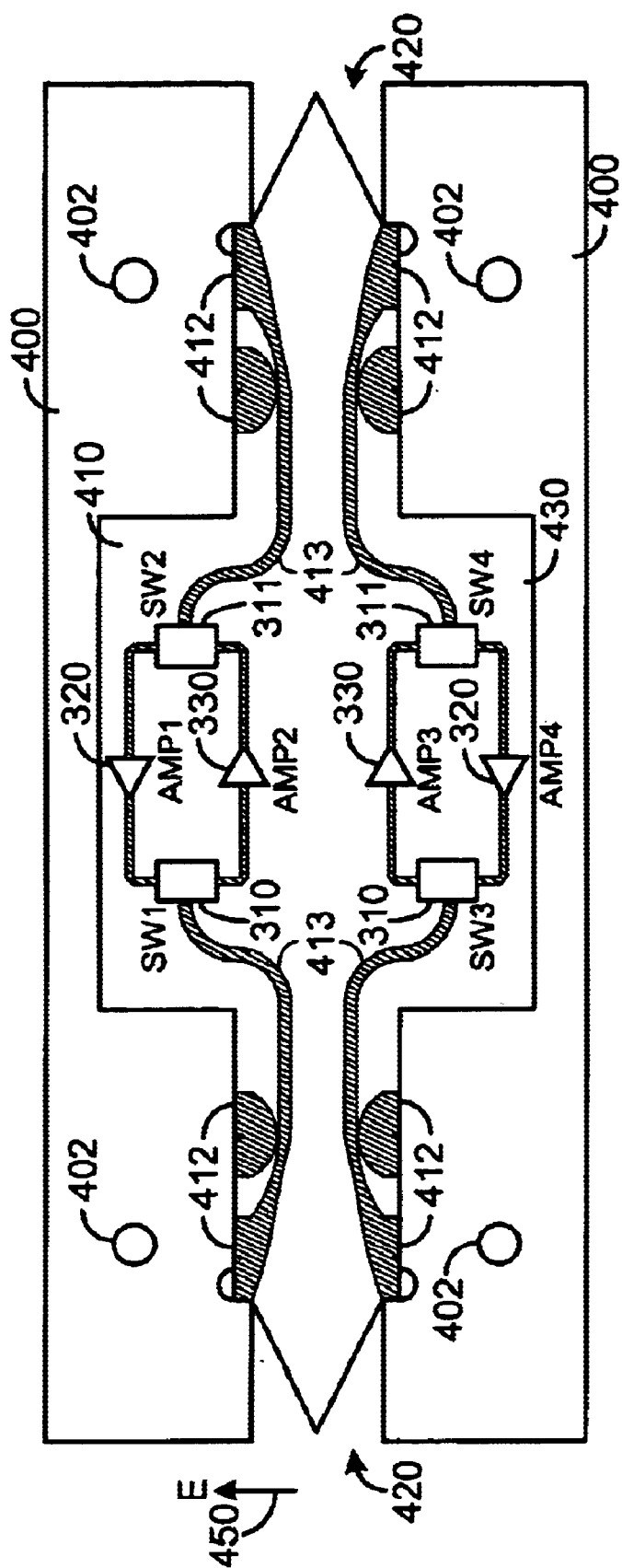
FIG. 4 is a diagram illustrating an amplifier module having the amplifiers depicted in FIGS. 2 and 3 mounted on a substrate and resting on a tray.
Figure 9:
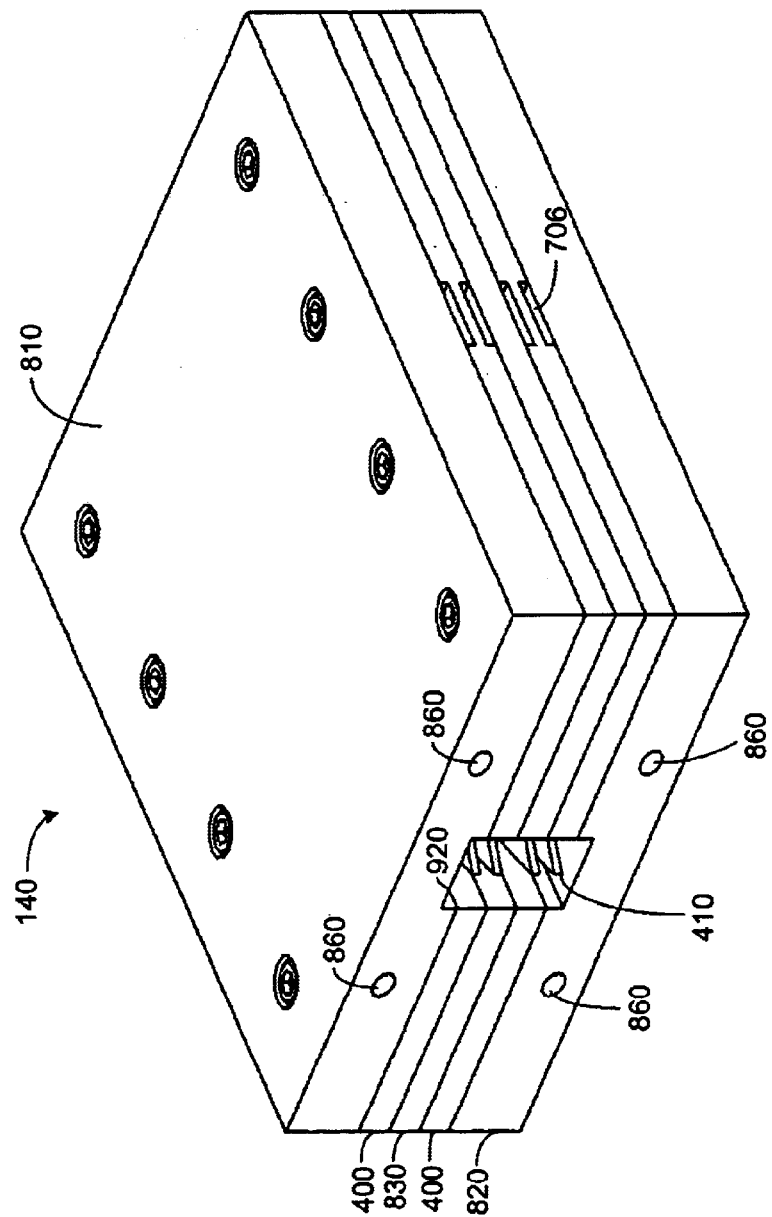
FIG. 9 is a diagram illustrating the bi-directional amplifier module of FIG. 1 as an assembled microwave module.

An illustration of a tray 400 holding an amplifier module 410 comprising two bi-directional amplifiers 144 and associated converters 142 and 143 is shown in FIG. 4. The tray 400 may be identical on the top and bottom sides having channels or grooves dimensioned for holding two of the amplifier modules or may have design variations to satisfy a particular application. The tray preferably has alignment holes 402 to keep surfaces aligned during bi-directional amplifier module assembly. An assembled module is shown in FIG. 9. Still referring to FIG. 4, the amplifier module 410 is comprised of a substrate and has metallic layers 412 deposited on a top side as shown and on a bottom side that is not shown. The metallic layers of each side function together to provide an antenna that serves as a converter. Converters 142 are two directional devices that may convert electromagnetic signals to electrical signals or convert electrical signals to electromagnetic signals. Each converter 142 is preferably coupled to the switch 310 of one of the amplifiers 144 within the module 410 by metallic deposits called "microstrips 413." Each converter 143 is preferably coupled to the switch 311 of one of the amplifiers 144 by another one of the microstrips 413. Note that in other embodiments, other conductive elements, such as bonded wires, may be employed in lieu of the microstrips 413 shown by FIG. 4.

Several types of well-known or future developed compact antenna structures may be employed to convert electromagnetic signals to electrical signals or, in other words, to implement the converters 142 and 143. It should be understood by those skilled in the art that well-known antenna structures provide for two-directional conversion. Antenna structures may be provided when metallic layers 412 are deposited in geometric shapes on the top and/or bottom of a substrate 430 such as aluminum nitride, RT/Duriod® or another material with similar properties.

An example of a converter structure forming a slotline antenna that may be employed to implement one or more of the converters is shown in FIG. 5A. The geometric shapes of the metallic layers for a slotline antenna are generally well known. Design and fabrication of an amplifier module having a slotline antenna typically uses conventional computer aided design and fabrication techniques. In the embodiment depicted by FIG. 5A, an upper metallic layer area 510 for a slotline antenna 500 is shown as having lines extending approximately. −45° to the X-direction. A bottom metallic layer area 520 is shown as having lines extending approximately 45° to the X-direction. Thus, as shown in FIG. 5A, the lines on upper and lower areas 510 and 520 are substantially orthogonal. A wire 530 may be bonded from the top metallic layer 510 and extend to a microstrip 540 for coupling to one of the switches 310 or 311. The microstrip 540 becomes a connection point for circuit elements mounted on the top of the substrate. An incident electric field 450 may be an entering or exiting electromagnetic signal. A cut 5B of the substrate, taken near the right end as shown, illustrates in FIG. 5B a distributed electric field 530 going from a ground plane, the lower layer 520, toward the microstrip 540 where the arrows represent the direction of the electrical field.

FIG. 6A depicts another type of converter structure, an antipodal finline to microstrip converter, that may be employed to implement one or more of the converters 142, 143. The incident electric field 450, as in FIG. 5B, may be an entering or exiting electromagnetic signal. The substrate 430 has an upper metallic layer 610 and a lower metallic layer 620. The shapes of the metallic layers 610 and 620 for the antipodal geometry may be generated using computer aided design software. The lower layer 620 and upper layer 610 may overlap as shown in FIG. 6A. The upper metallic layer 610 provides a microstrip 640 for directing, electrical signals toward one of the switches 310, 311. Electrical fields going from the upper metallic layer to the lower metallic layer are shown in FIGS. 6B, 6C, 6D as cuts 630, 632 and 634. The shape of the metal layers and the characteristics of the antenna may vary, but preferably a converter incorporating antipodal finline transitions is utilized for the converters of the present invention.

Figure 7:
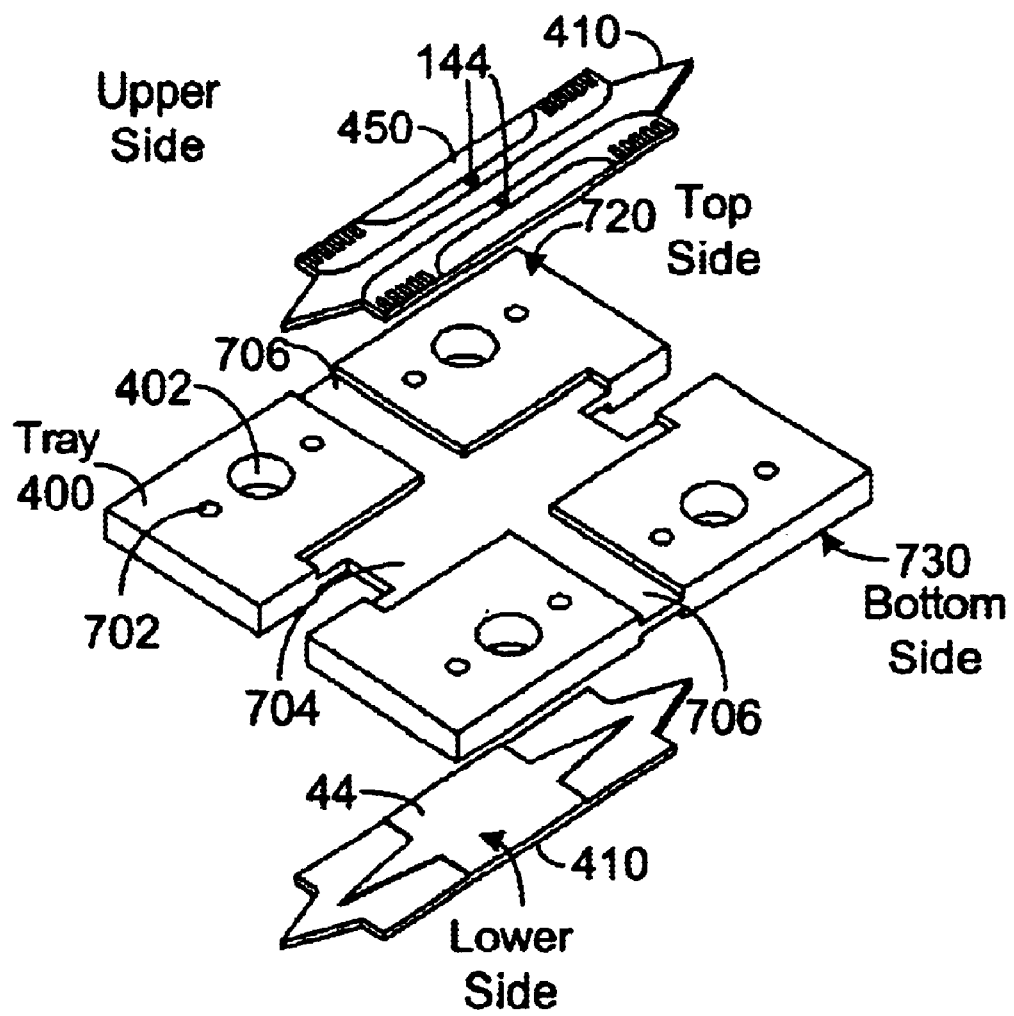
FIG. 7 is a diagram illustrating the amplifier module of FIG. 4 and a tray that is adapted to hold the module.

FIG. 7 is the first of several illustrations used to describe an exemplary assembly of the stackable trays 400 providing a modular structure for the bi-directional amplifier module 140. A channel 704 is dimensioned to hold one amplifier module 410 on the top side of the tray, and another channel (not shown) is similarly dimensioned to hold another amplifier on the opposite side (i.e., the bottom side) of the tray. Access channels 706 may be available for power supply connections, logic connections, measurement connections and other access connections. The upper side 450 of amplifier module 410 is shown with an exemplary metallic layer 710 (not layers as shown in FIG. 5A or 6A) and two of the bi-directional amplifiers 144. When the amplifier module is turned over as shown by a second amplifier module near the bottom of FIG. 7, another exemplary metallic layer 720 is revealed. One amplifier module 410 fits within the top side channel 704 on the top side of the tray 400, and another amplifier module 410 fits within the bottom-side channel (not shown) on the bottom side of the tray.

Figure 8:
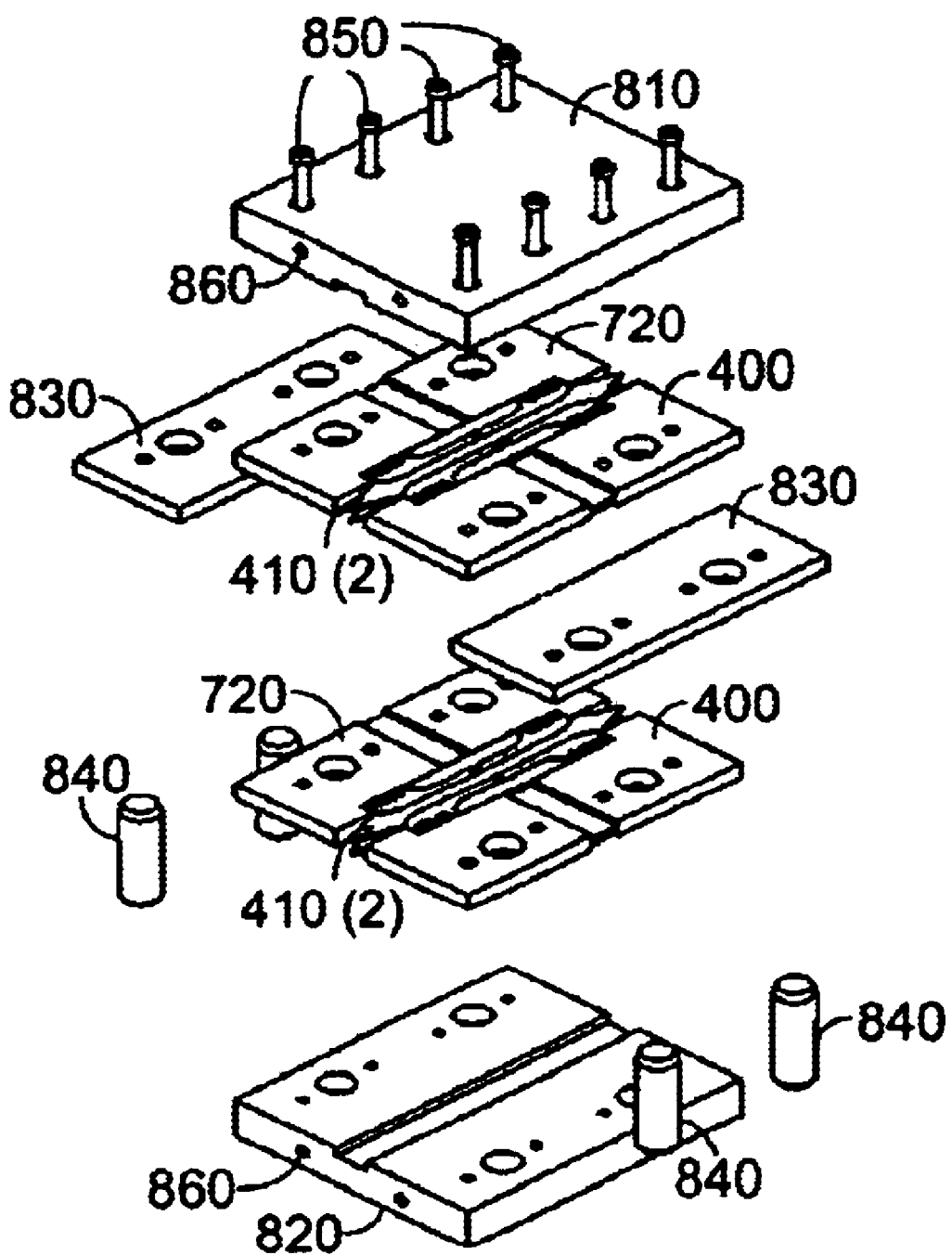
FIG. 8 is an assembly drawing showing how the trays for holding amplifier modules may fit together to form the bi-directional amplifier module of FIG. 1.

FIG. 8 is an assembly drawing having sufficient parts for providing a bi-directional amplifier module 140 that contains four amplifier modules 410 on two trays 400. A module base 820 and module top 810 are used to contain module spacers 830 and the two trays 400. Alignment pins 840 placed in the module base 820 may be passed through the alignment holes 402 of each of the trays 400 and thereby act as guides for aligning the trays 400 and the spacers 830. Fasteners 850, such as bolts, may be used to secure the parts of the module 140 in position. Each end of the assembled bi-directional amplifier module has threaded waveguide attachment holes 860 for securing a waveguide on each end of the bi-directional amplifier module's structure. If each of the amplifier modules has two of the bi-directional amplifiers, there are eight amplifiers available for upstream and downstream amplification. The control logic unit 146 preferably is used to transition the bi-directional amplifiers between upstream and downstream amplifier states. Note that trays 400 may be added or removed as desired in order to achieve a desired level of amplification. FIG. 9 illustrates the bi-directional amplifier module 140 with all the parts of FIG. 8 secured in place.

Figure 10:
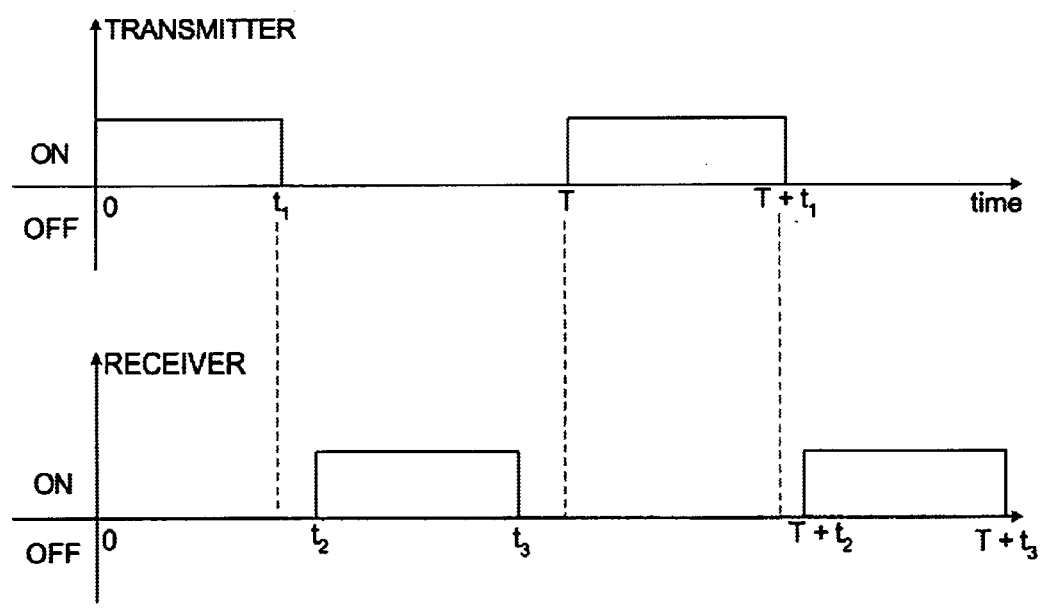
FIG. 10 is a diagram illustrating an exemplary timing diagram for the bi-directional amplifier of FIG. 2.

For some applications, such as radar, the bi-directional amplifier module 140 is programmed to sequentially amplify a downstream electromagnetic signal during a first time interval and to amplify an upstream signal during a second time interval. To reduce interference, the time bands (or intervals) for downstream amplification and upstream amplification are mutually exclusive and may have guard times between the amplifications. FIG. 10 illustrates an exemplary timing sequence for providing alternating amplification in accordance with the preferred embodiment. The logic control unit 146 may have timing circuits or receive timing from the transceiver 170 to provide control signals to the switches. As shown in FIG. 10, between time interval 0 to T, the control logic unit 146 puts each of the amplifiers 144 into a downstream amplification state, and the transmitter 110 transmits an electromagnetic signal in a downstream direction. This signal is engaged by the amplifiers 144 before being passed to the remote device 150. Between times $t_1$ and $t_2$, a first guard time, the control logic unit 145 transitions each of the amplifiers 144 into an upstream amplification state and data is neither transmitted nor received by the transmitter 110 and receiver 120. From time $t_2$ to $t_3$, the amplifiers 144 are in an upstream amplification state. Therefore, signals received from the remote device 150 are amplified by the amplifiers 144 and received by the receiver 120. Between time $t_3$ and T, a second guard time, the control logic unit 145 transitions each of the amplifiers 144 into a downstream amplification state, and signals are neither transmitted nor received by the transmitter 110 and receiver 120. At time T, the timing sequence repeats.

Figure 11:
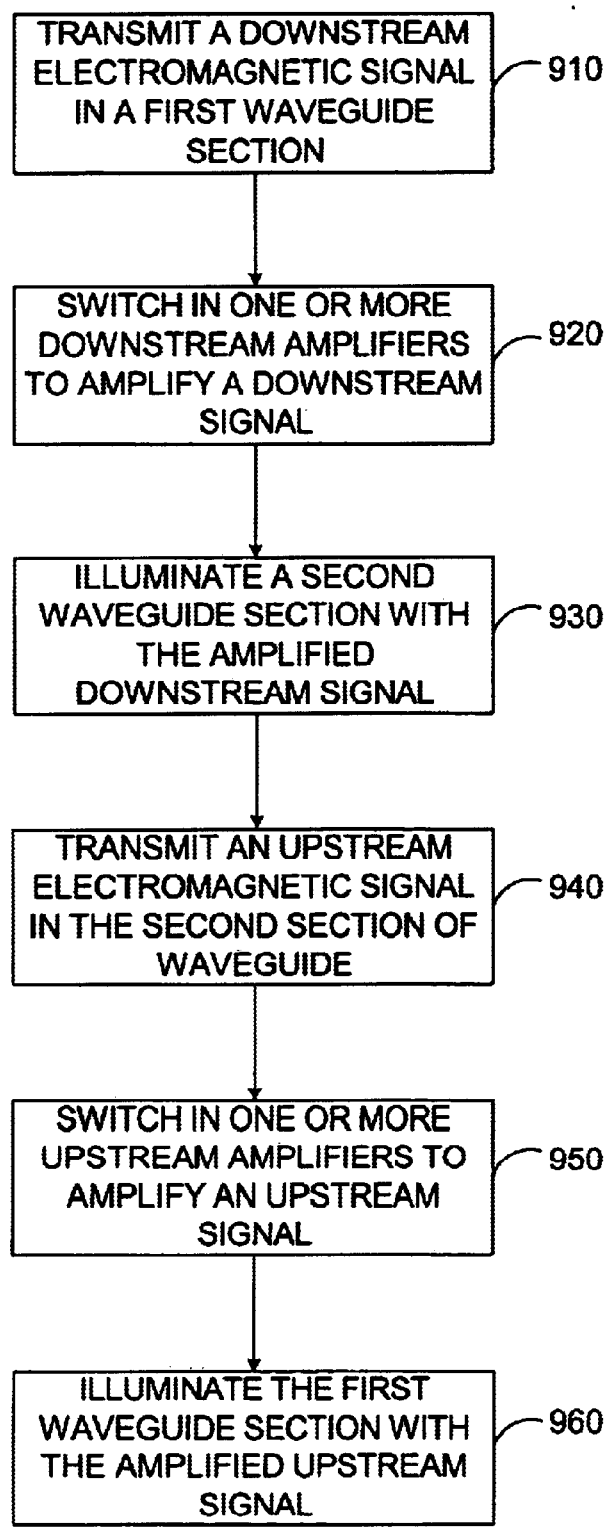
FIG. 11 is a flow chart illustrating an exemplary architecture and functionality bi-directional amplifier module of FIG. 1.

An exemplary use and operation bi-directional amplifier module 140 will now be described with reference to FIG. 11, in particular. A source transmits, step 910, a downstream electromagnetic signal, in a first waveguide section. The first waveguide section is coupled to the port one 164 of the bi-directional amplifier module 140. Next each of the downstream amplifiers 330 of the amplifier 144 is preferably coupled to and amplifies a portion of the downstream electrical signal, step 920. Each of the amplified portions is then converted to an amplified downstream electromagnetic signal and coupled to a second waveguide section, step 930.

After the transmitter 110 stops transmitting pursuant to a predefined timing sequence and the amplifier 144 is placed in the upstream amplifier state, an upstream electromagnetic signal is transmitted in the second waveguide section, step 940. Each of the upstream amplifiers 320 is preferably coupled and amplifies the upstream electrical signal from the second waveguide section, step 950. Each of the amplified upstream portions is converted to an amplified upstream electromagnetic signal that illuminates the first waveguide section, step 960. The adaptive amplification available by selecting a chosen number of amplifiers from the bi-directional amplifiers of the bi-directional amplifier module provide a bi-directional amplifier module that may be used in a variety of microwave systems.

Figure 12:
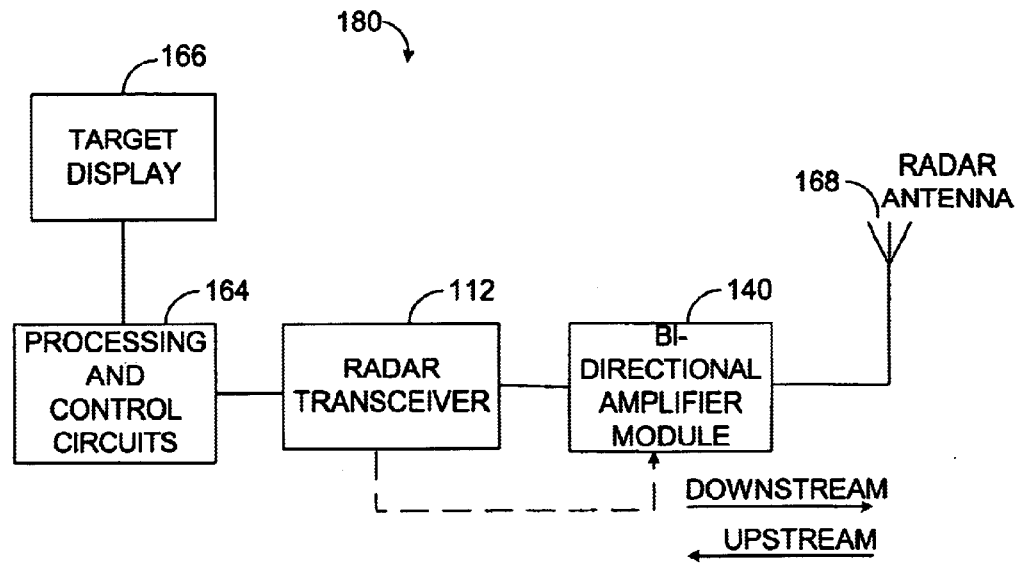
FIG. 12 is a block diagram of a radar system using bi-directional amplifier module of FIG. 2.

A block diagram of a radar system 180 employing a bi-directional amplifier 140 in accordance with the preferred embodiment shown in FIG. 12. Processing and control circuits 164 control the transmission and reception of a radar transceiver 112 according to a predefined timing sequence, such as described hereinabove. When the radar transceiver 112 transmits a downstream signal, the bi-directional amplifier module 140 amplifies the signal, which is then radiated from radar antenna 168. Then, received echoes from a target are coupled from the radar antenna 168 and sent upstream through the bi-directional amplifier module 140, which amplifies the echo signal after the amplifier has been placed into the upstream amplification state. The amplified echo signal is then processed by processing and control circuits 164 and displayed on a target display monitor 166. Signals from the radar transceiver 112 may provide input signals 163 to the logic control unit 146 (FIG. 2) of the bi-directional amplifier module 140 that selects the amount of amplification requested in each direction and turns amplifiers off and on as appropriate to achieve the desired amplification.

Figure 13:
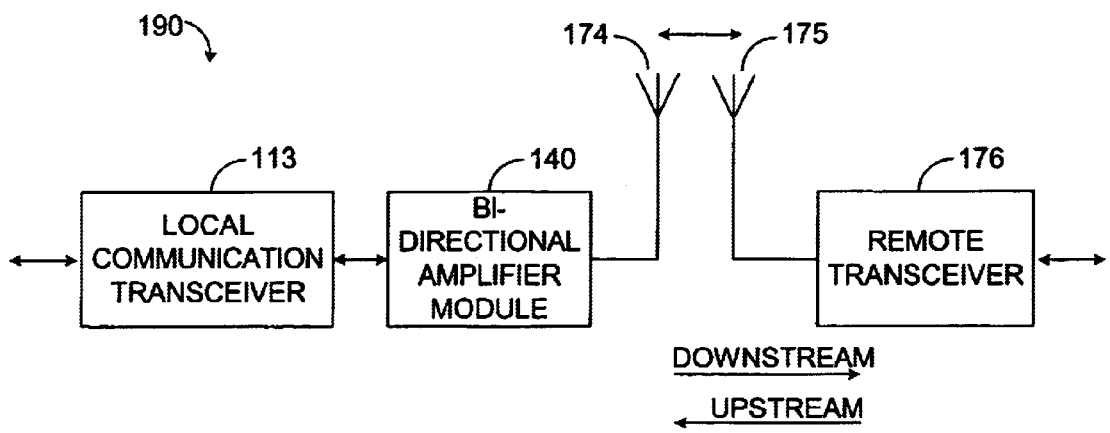
FIG. 13 is a block diagram illustrating an exemplary communication system using the bi-directional amplifier module of FIG. 1.

FIG. 13 illustrates the use of the bi-directional amplifier module 140 for a half-duplex communication link. A local communication transceiver 113 may provide an input signal to the bi-directional amplifier module 140. The bi-directional amplifier module 140 may then amplify and send the amplified signal to a first communication antenna 174. The first antenna 174 directs a microwave signal to a second communication antenna 175. Energy received by the second antenna 175 may then be coupled to a remote transceiver 176 for processing and distribution. The remote transceiver 176 then transmits a communication signal in the upstream direction to the second antenna 175. When the first antenna 174 receives the upstream communication signal from the second antenna 175, the signal is coupled to bi-directional power amplifier 140 that is now configured for upstream amplification.

Since a single waveguide may be used to couple microwave signals between the local communication transceiver and the bi-directional amplifier module and a single waveguide is used to couple microwave signals from the power amplifier there may be savings in space and costs. The half-duplex communication system using the bi-directional amplifier module may be used when downstream data rates are either symmetric or asymmetric.

In addition, a full-duplex communication system may be provided utilizing the bi-directional amplifier module 140 as configured in FIG. 13. In a preferred embodiment for such a full-duplex communication system each switch 310, 311 of FIG. 3 may be replaced by a diplexer. In addition the transceivers 113, 176 transmit downstream and upstream energy in different frequency bands. Preferably the downstream electromagnetic signal is transmitted in a first frequency band and the upstream electromagnetic signal is transmitted in a second frequency band. The first frequency band and the second frequency band preferably have non-overlapping frequency spectra.

We claim:

1. A bi-directional amplifier module comprising:
   a downstream illumination source in a first microwave channel;
   an upstream illumination source in a second microwave channel;
   an array of converters for receiving illuminations and for illuminating said microwave channels; and
   an array of bi-directional amplifiers coupled between said converters and configured to amplify downstream signals and to amplify upstream signals in response to control signals from a logic control unit.

2. The bi-directional amplifier module of claim 1, wherein the microwave channels are waveguides.

3. The bi-directional amplifier module of claim 2, wherein one of the waveguides is coupled to a radar transceiver and another of the waveguides is coupled to a radar antenna.

4. The bi-directional amplifier module of claim 2, wherein the waveguides are coupled to communication transceivers.

5. The bi-directional amplifier module of claim 1, wherein the bi-directional amplifiers have adaptable power gains and output power.

6. The bi-directional amplifier module of claim 2, wherein the waveguides are rectangular.

7. The bi-directional amplifier module of claim 1 wherein the microwave channels are coaxial cables.

8. The bi-directional amplifier module of claim 1, wherein the converters are antipodal finline converters.

9. A method for providing bi-directional amplification comprising the steps of:
   illuminating an array of upstream converters and downstream converters;
   converting, via the upstream and downstream converters, illuminations to downstream electrical signals and upstream electrical signals;
   receiving the downstream electrical signals at downstream amplifiers;
   combining downstream amplified signals at the upstream converters for downstream amplified illumination;
   receiving the upstream electrical signals at upstream amplifiers; and
   combining upstream amplified signals at the downstream converters for upstream amplified illumination.

10. The method of claim 9, further comprising the step of:
    transmitting the downstream amplified illumination to a radar antenna and the upstream amplified illumination to a radar receiver.

11. The method of claim 9, further comprising the step of:
    transmitting the downstream amplified illumination to a communication antenna and the upstream amplified illumination to a communication receiver.

12. A system for providing bi-direction amplification:
    an array of switchable downstream and upstream amplifiers;
    illumination sources for a downstream direction and a upstream direction; and
    an array of converters for coupling the illumination sources to and from said amplifiers.

13. The apparatus of claim 12 wherein, the converters are antipodal finline converters.

14. The apparatus of claim 12, wherein the converters are slotline converters.

15. An apparatus for providing bi-directional amplification comprising:
  a first electromagnetic signal;
  a second electromagnetic signal; and
  a module having a first and second port, wherein the first port receives said first electromagnetic signal and the second port receives the second electromagnetic signal, the module configured to convert said electromagnetic signals into first electrical signals for amplification by first amplifiers and into second electrical signals for amplification by second amplifiers wherein the first amplified signals illuminate said second port and the second amplified signals illuminate said first port.

16. The apparatus of claim 15, wherein said electromagnetic signals are contained in waveguides and said first port is coupled to one of the waveguides and said second port is coupled to another of the waveguides.

17. The apparatus of claim 15, wherein said electromagnetic signals occur in mutually exclusive time bands.

18. The apparatus of claim 15, wherein said amplifiers are coupled to said electrical signals by logic controlled switches.

19. The apparatus of claim 15, wherein each of said amplifiers have approximately the same gain and output power.

20. The apparatus of claim 15, wherein said amplifiers have adaptable gains and output power.

21. The apparatus of claim 15, wherein said first electromagnetic signal and said second electromagnetic signal have approximately the same frequency spectrum.

22. The apparatus of claim 15, wherein said first electromagnetic signal and said second electromagnetic signal have different frequency spectra.

23. The apparatus of claim 15, wherein said first electromagnetic signal is a radar transmit signal and said second electromagnetic signal is an echo return of the radar transmit signal.

24. The apparatus of claim 15, wherein said first electromagnetic signal is a downstream communication signal and said second electromagnetic signal is an upstream communication signal.

25. A microwave communication system, comprising:
  a first waveguide;
  a second waveguide; and
  a bi-directional amplifier module coupled to the first and second waveguides, the bi-directional amplifier module configured to receive a downstream electromagnetic signal from the first waveguide, to amplify the downstream electromagnetic signal, and to transmit the amplified downstream signal to the second waveguide, the bi-directional amplifier module further configured to receive an upstream electromagnetic signal from the second waveguide, to amplify the upstream electromagnetic signal, and to transmit the amplified upstream signal to the first waveguide.

26. The system of claim 25, wherein said bi-directional amplifier module further comprises control logic configured to enable the bi-directional amplifier module to selectively amplify said electromagnetic signals.

27. The system of claim 25, further comprising:
  a radar transceiver coupled to the first waveguide; and
  an antenna coupled to the second waveguide, wherein the upstream electromagnetic signal is an echo of the downstream electromagnetic signal.

28. The system of claim 25, further comprising:
  a communication transceiver coupled to the first waveguide; and
  an antenna coupled to the second waveguide, wherein the upstream electromagnetic signal is a communication signal from a remote site.

29. The system of claim 25, wherein the bi-directional amplifier module comprises:
  a downstream amplifier;
  an upstream amplifier;
  a first switch coupled to an input of the downstream amplifier and to an output of the upstream amplifier;
  a second switch coupled to an input of the upstream amplifier and to an output of the downstream amplifier; and
  control logic configured to the first and second switches such that the downstream amplifier receives and amplifies the downstream electromagnetic signal and such that the upstream amplifier receives and amplifies the upstream electromagnetic signal.

30. The system of claim 29, wherein the control logic is configured to control the first and second switches such that the downstream amplifier is electrically isolated from the first and second waveguides when the upstream amplifier is amplifying the upstream electromagnetic signal and such that the upstream amplifier is electrically isolated from the second waveguides when the downstream amplifier is amplifying the downstream electromagnetic signal.

31. The system of claim 25, wherein the bi-directional amplifier module comprises:
  a first array of converters, each of the first array of converters configured to receive a portion of the downstream electromagnetic signals;
  a second array of converters, each of the second array of converters configured to receive a portion of the downstream electromagnetic signals; and
  a plurality of bi-directional amplifiers, each of the bi-directional amplifiers associated with a different one of the first array of converters and a different one of the second array of converters, each of the bi-directional amplifiers configured to receive and amplify a portion of the downstream electromagnetic signal from the associated first array converter to provide the amplified downstream portion to the associated second array converter, each of the bi-directional amplifiers further configured to receive and amplify a portion of the upstream electromagnetic signal from the associated second array converter and to provide the amplified upstream portion to the associated first array converter.

32. A bi-directional processing module comprising:
  a downstream illumination source in a first microwave channel;
  an upstream illumination source in a second microwave channel;
  an array of converters for receiving illuminations and for illuminating said microwave channels; and
  an array of processing elements coupled between said converters and adapted to process downstream and upstream signals.

* * * * *